United States Patent [19]

Rohatgi et al.

[11] Patent Number: 4,522,657

[45] Date of Patent: Jun. 11, 1985

[54] LOW TEMPERATURE PROCESS FOR ANNEALING SHALLOW IMPLANTED N+/P JUNCTIONS

[75] Inventors: Ajeet Rohatgi, Murrysville; Prosenjit Rai-Choudhury, Export, both of Pa.; Joseph R. Gigante, Beltsville, Md.; Ranbir Singh; Stephen J. Fonash, both of State College, Pa.

[73] Assignee: Westinghouse Electric Corp., Pittsburgh, Pa.

[21] Appl. No.: 543,745

[22] Filed: Oct. 20, 1983

[51] Int. Cl.³ .......................................... H01L 21/263
[52] U.S. Cl. .................................. 148/1.5; 29/576 B; 29/576 T; 357/30; 357/91; 148/187
[58] Field of Search ............... 148/1.5, 187; 29/576 B, 29/576 T; 357/91, 30

[56] References Cited

U.S. PATENT DOCUMENTS

| | | | |
|---|---|---|---|
| 3,589,949 | 6/1971 | Nelson | 148/1.5 |
| 3,982,967 | 9/1976 | Ku et al. | 148/1.5 |
| 4,047,976 | 9/1977 | Bledsoe et al. | 148/1.5 |
| 4,113,514 | 9/1978 | Pankove et al. | 148/1.5 |
| 4,266,986 | 5/1981 | Benton et al. | 148/1.5 |
| 4,364,779 | 12/1982 | Kamgar et al. | 148/1.5 |
| 4,368,083 | 1/1983 | Bruel et al. | 148/1.5 |

OTHER PUBLICATIONS

Ohmura et al., Phys. Stat. Sol., 15a (1973) 93.
IEEE Transactions on Electron Devices, vol. ED-22, No. 8, Aug. 1975, Current Gain Recovery in Silicon Nitride Passivated Planar Transistors by Hydrogen Implantation-Walter Kellner and Adolf Goetzberger.
Journal of Vacuum Science Technology, 20(3), Mar. 1982, Passivation of Grain Boundaries in Silicon-C. H. Seager, D. J. Sharp, and J. K. G. Panitz.

Primary Examiner—Upendra Roy
Attorney, Agent, or Firm—Joel Petrow

[57] ABSTRACT

Disclosed is a low temperature technique for annealing implantation damage and activating dopants. Conventional furnace annealing requires temperatures as high as 1000° to 1100° C. to completely anneal the dopant implantation damage; 75 KeV arsenic implantation followed by 550° C. for 75 minutes and 900° C. for 30 minutes in nitrogen for instance is not sufficient to anneal the implantation damage and results in a leakage current of the order of 1 mA per $cm^2$. If, however, subsequent to the arsenic implantation, 0.4 KeV hydrogen ions are implanted using a Kaufman ion source with an accelerator current of 200 milliamp, then only 500° to 600° C. for one hour anneal in nitrogen is sufficient to eliminate the arsenic implantation damage. This results in a leakage current of the order of 5 to 25 nA per $cm^2$ and a complete dopant activation is achieved.

11 Claims, 5 Drawing Figures

LOW TEMPERATURE PROCESS FOR ANNEALING SHALLOW IMPLANTED N+/P JUNCTIONS

BACKGROUND OF THE INVENTION

One of the major problems facing semiconductor technology in its evolution toward submicron devices is that of dopant redistribution during dopant activation and annealing of ion implant junctions. Annealing of ion implanted damage has been the focus of considerable attention in recent years. The usually simple low cost furnace annealing of implantation damage has been found to be unacceptable for very large scale integrated applications because of substantial dopant redistribution. Stringent requirements of very large scale integrated circuits (VLSI) have made low temperature processing not only attractive but essential. High temperature processing makes tight dimensional control difficult and can even result in undesirable wafer warpage. In metal oxide semiconductor (MOS) circuits any lateral diffusion of implanted species from the source and drain can affect the channel length and also alter the channel doping. This can change the terminal characteristics of the devices considerably. Further, shallow implants are also needed for other devices such as shannon diodes, solar cells, etc. Conventional simple furnace annealing requires temperature as high as 1100° C. to completely anneal ion implantation damage. Back side gettering using phosphorous has been successful in reducing these anneal temperatures from 1100° C. to 950° C. but this temperature range is still too high for the low temperature (i.e. temperatures less than 800° C.) processing required in VLSI. Hence considerable effort in recent years has gone into the development of processes that anneal out implantation damage and result in dopant activation without the attendant phenomenon of dopant redistribution.

Ion implantation has become a powerful VLSI tool for the formation of heavily doped shallow junctions. However ion implantation is generally followed by greater than 850° thermal anneal to remove the implantation damage and activate the dopants. Such high temperature anneal is not desirable and may be unacceptable for very shallow junctions ($\leq 0.1$ $\mu$m). In addition implantation of phosphorous and arsenic at high dose levels severely damages the crystal lattice and subsequently is difficult to anneal even at high temperatures (900° C.). This tends to make the implanted junctions more leaky resulting in lower breakdown voltages. Therefore it is necessary to develop methods for completely annealing implantation damage preferably at low temperatures.

Consequently interest has moved to alternative techniques for annealing of ion implantation damage. Local annealing techniques employing laser beams or electron beams have proved effective in annealing out ion implantation damage. However it is recognized that the local melting and rapid solidification produced by these beam approaches usually leaves behind residual defects that are electrically active and may require furnace anneals with temperatures in excess of 600° C. for their removal. Two other alternative techniques rapid thermal annealing (RTA) using incoherent light sources and strip heater annealing are also being used. For these two approaches the surface temperature of the silicon reaches 1000° C. to 1200° C. and hence they are not low temperature processes. In addition the heating and cooling rates involved are fast, of the order of seconds, and can induce stresses in silicon substrates.

These processes then can generally be classified into two broad categories: localized beam annealing which includes laser and electron beam annealing and rapid thermal annealing (RTA) which herein will be taken to include processes employing pulsed incoherent lamp sources or graphite strip heating. From the point of economy of time, localized beam annealing fares the best with anneal times of the order of seconds. The beam, laser or electron, is directed on a very small region at the surface rapidly bringing the silicon temperature up to a point where epitaxial regrowth can result. However the rapid localized heating and melting and cooling and solidification involved can result in imperfections in the lattice and can give rise to electrically active defects.

Rapid thermal anneals employing pulsed incoherent light sources for annealing ion implantation damage typically use pulse durations of the order of a few hundred microseconds with incident energies in a range of 20 to 30 joules/cm$^2$. This approach can be used for the uniform annealing and dopant activation of large areas. Rapid thermal anneals using graphite strip heaters are equally effective. However, it has been shown that RTA at least for the case of graphite strip heaters produces annealed implanted layers that degrade under simulated subsequent low temperature processing. Both RTA approaches uniformly heat the damaged silicon layer. However, both bring the temperature of the whole silicon surface to the 1000° to 1200° C. range and consequently neither is a true low temperature process.

Hydrogen is generally believed to bond chemically to any dangling bonds in the silicon and in the energy band picture to move localized states in the band gap to the band edges. Successful demonstration of the reduction of bulk recombination centers in ribbon silicon using hydrogen ions as a passivant has been shown by Seager. Laser beam damage silicon exposed to a hydrogen plasma for four hours experienced a total passivation of residual point defects. Further, hydrogen is believed to be responsible for the low surface state density seen in MOS capacitor structures after a low temperature post metalization hydrogen anneal.

SUMMARY OF THE INVENTION

In accordance with the method of the present invention for low temperature annealing of ion dopant implantation damage, hydrogen ions are implanted after the dopant implantation followed by a low temperature annealing in nitrogen. A Kaufman ion source is used for H+ implantation which allows large dosages to be implanted in a very short time. At higher dopant doses the implantation damage is extensive enough to help the dopant activation at low temperature annealing. The presence of hydrogen ions in the lattice passivates the defects which usually require high temperature anneal and in some instances are not thermally annealable. A net result is a low leakage shallow junction device fabricated at about 500° C.

DESCRIPTION OF THE PREFERRED EMBODIMENT

The preferred method of practicing this invention uses a low energy hydrogen ion beam to passivate the defects resulting from the implantation of an $n^+$ region into p-type silicon and uses a low temperature furnace anneal to activate the dopants. The $n^+/p$ junctions employed were made by implanting 70 to 75 KeV $As^+$ ions into p-type boron doped silicon which had channel stops present. The dosage was $5 \times 10^{15}$ arsenic atoms/cm$^2$ and the implanted area was $3.7 \times 10^{-2}$ cm$^2$. Using a Kaufman type ion source 0.4 KeV $H^+$ ions were implanted into the above structure for one minute. The hydrogen ion beam had an extractor voltage of 0.3 KeV and an accelerator current of 200 mA. The silicon samples were then annealed at 500° C. or 600° C. for one hour in nitrogen or argon ambience. Spreading resistance measurements were subsequently made to examine the dopant profile and the degree of dopant activation. Current-voltage (I-V) measurements were made at different temperatures to examine the diode characteristics and transport mechanisms.

Figure 1:
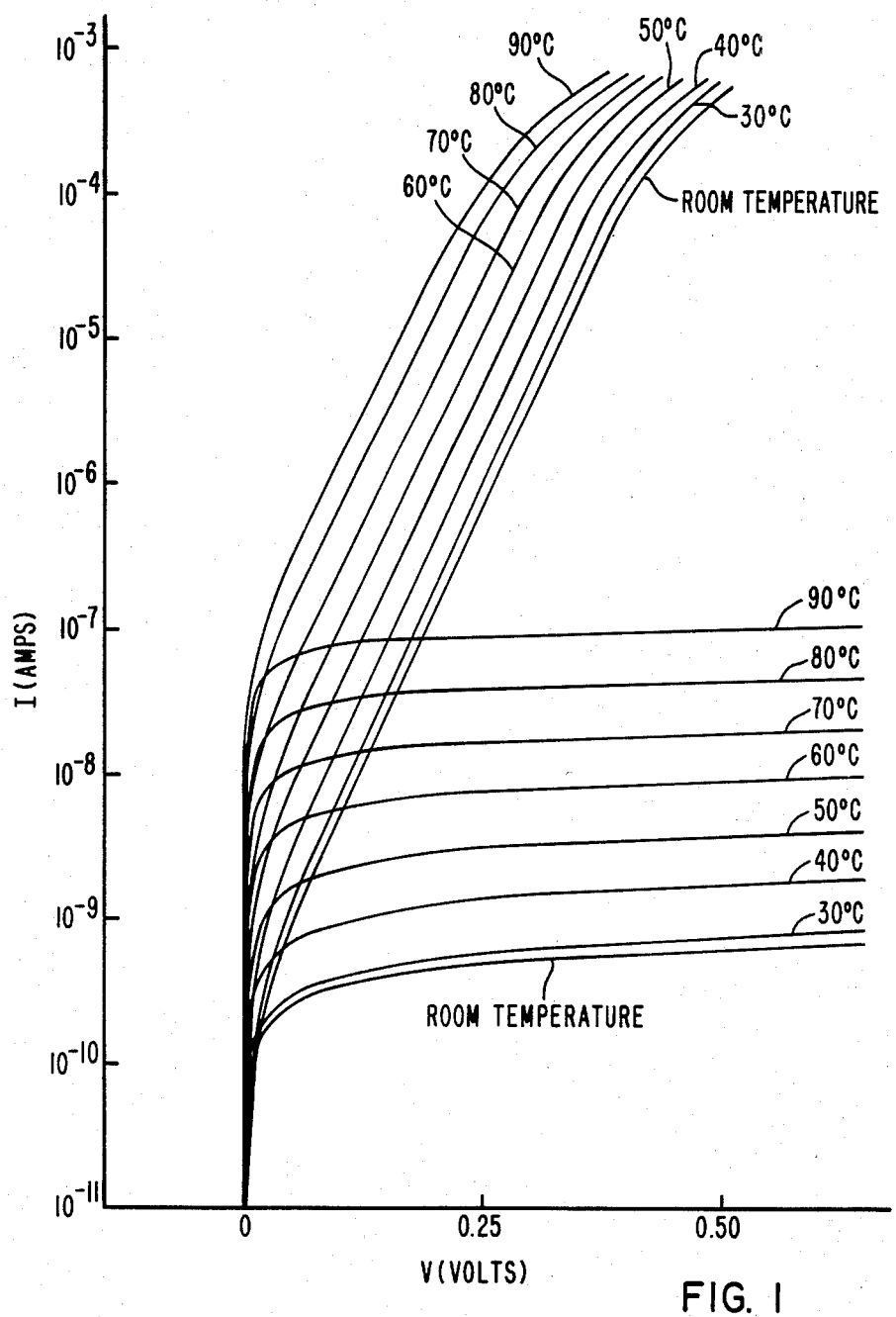
FIG. 1 shows representative current-voltage-temperature characteristics for diode structures annealed at 500° C. after low energy hydrogen ion implantation.
Figure 2:
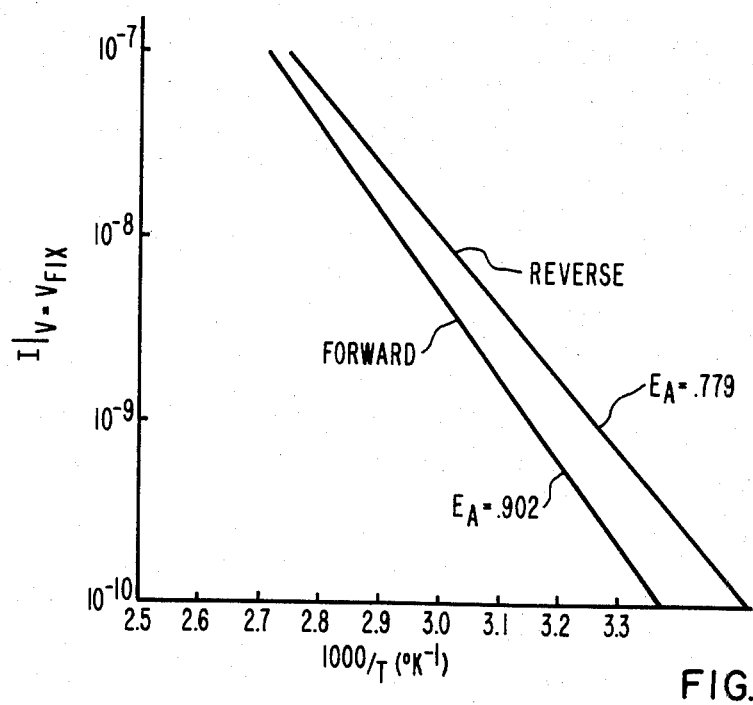
FIG. 2 shows the activation energy plot of the diode annealed at 500° C. after low energy hydrogen ion implantation.
Figure 4:
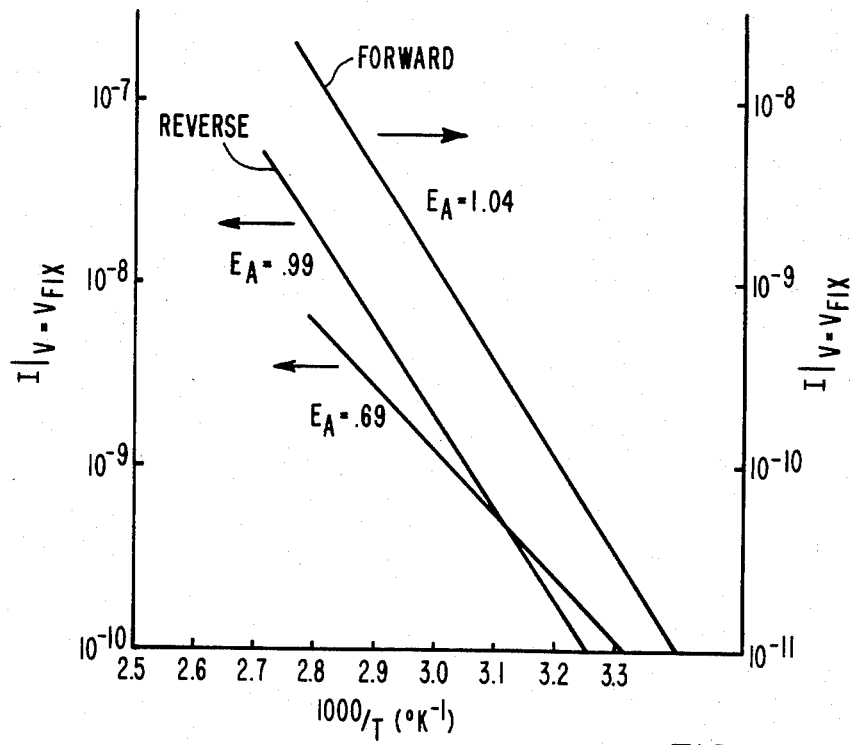
FIG. 4 shows the activation energy plots of the diode annealed at 600° C. after low energy hydrogen ion implantation.
Figure 3:
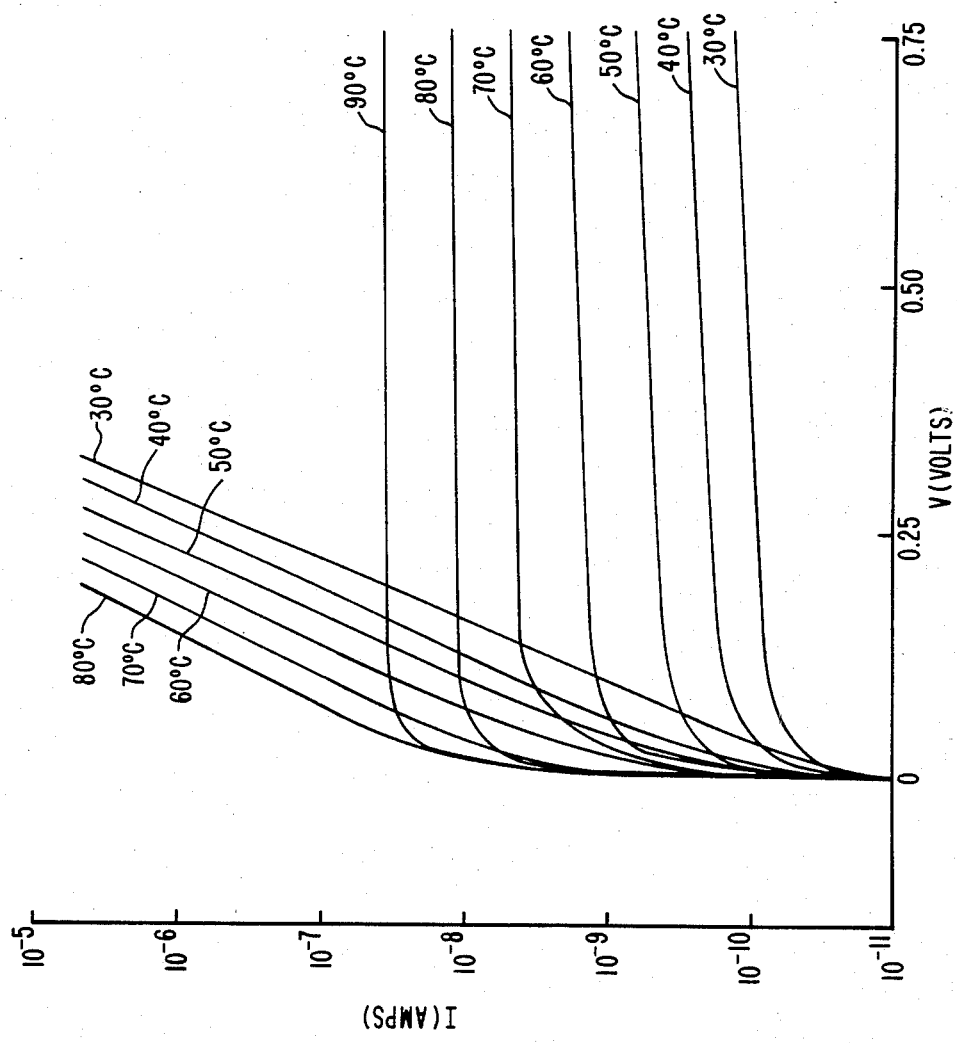
FIG. 3 shows current-voltage-temperature characteristics for diode structures annealed at 600° C. after low energy hydrogen ion implantation.

FIG. 1 shows representative I-V-T characteristics for diode structures annealed at 500° C. after the low energy hydrogen ion implantation. FIG. 2 shows the corresponding activation energy plot of this diode for forward and reverse bias. The diode quality factor for these diodes was $n \simeq 1.1$ over five decades. As seen in FIG. 2 the activation energy in the forward bias approximately 0.9 eV is greater than the activation energy of the diode in the reverse bias approximately 0.78 eV. FIG. 3 shows I-V-T for diode structures that underwent a 600° C. one hour anneal in N$_2$ after a low energy hydrogen implant. FIG. 4 shows the activation plots obtained from the forward and reverse current measurements. The activation energy from the forward bias was measured to be 1.04 eV. The plot of I versus 1000/T for the reverse current however, shows two activation energies: 0.69 eV for temperatures near room temperature and 0.99 eV for temperatures above 50° C.

In the case of the 600° C. annealed diodes the activation energy of 0.99 eV in reverse bias for $T \geq 50°$ C. suggests the dominance of diffusion-recombination current even in reverse bias at higher temperatures. That is, the generation-recombination current is now smaller even in reverse bias than the diffusion-recombination current for temperatures greater than or equal to 50° C. At room temperature the lower activation energy in reverse bias is suggestive of a generation recombination current indicating that some electrically active defects are still present even in the 600° C. annealed diodes. While it is not possible to passivate all the defects, a regime is approached where the generation-recombination component of the current is comparable to the diffusion-recombination current component even in reverse bias. The latter component is the ultimate limit attainable. The reverse leakage of these diodes, H$^+$ implant followed by a one hour 600° C. anneal N$_2$, was measured to be about 5 nA/cm$^2$ at a reverse voltage of 1.5 V which is comparable to the values obtained using high temperature incoherent light beam anneals.

Figure 5:
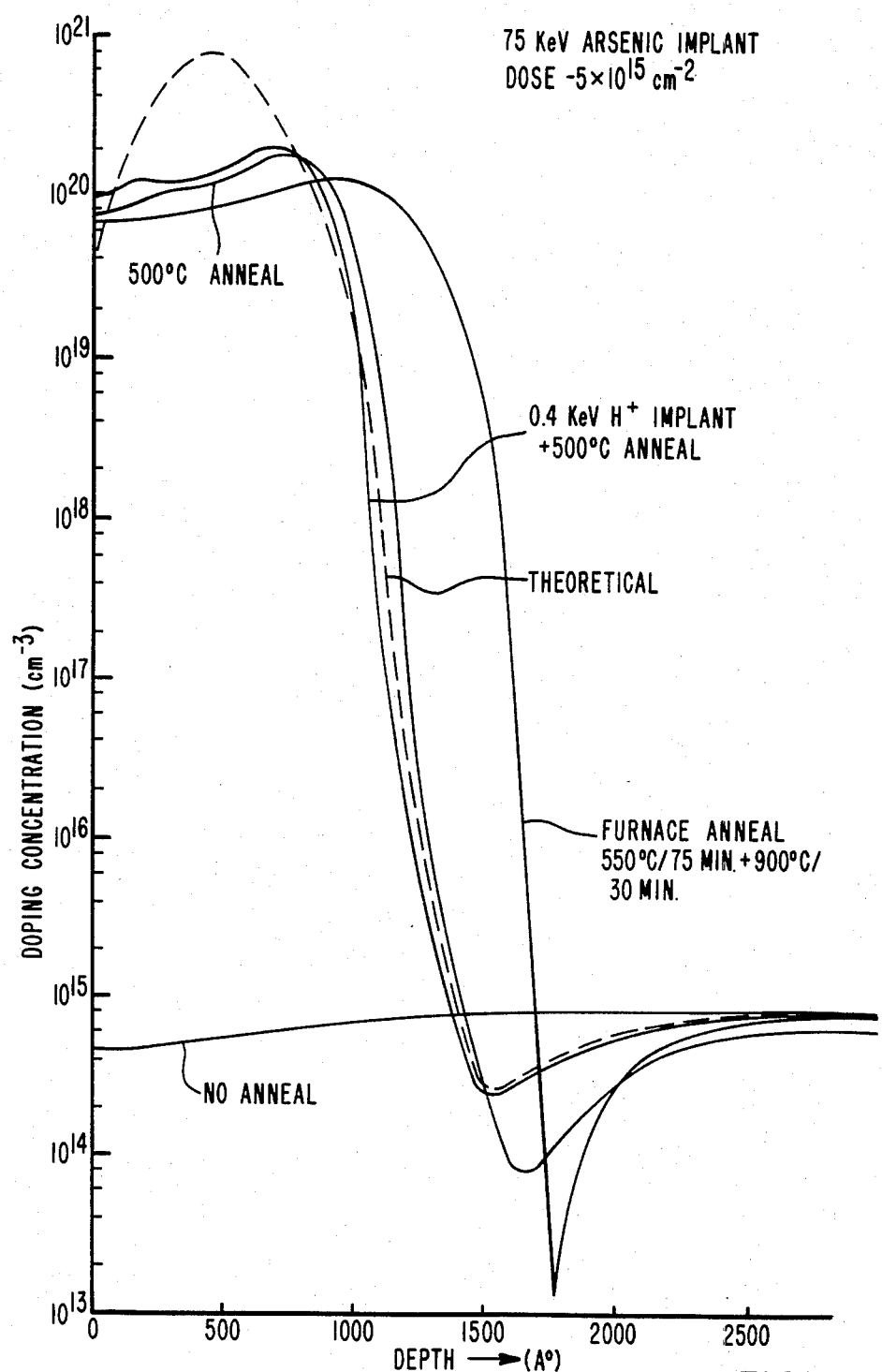
FIG. 5 shows the results of spreading resistance measurements for diodes that underwent various forms of treatment after arsenic doping implantation.

The results of spreading resistance measurements are shown in FIG 5. Also shown in the Figures is a spreading resistance plot for a diode that did not have any H$^+$ implant but was annealed at 550° C. for 75 minutes and than at 900° C. for 30 minutes. Also shown is the As implanted profile derived by theory. The junction depth after a 600° C. one hour anneal shows very little dopant redistribution. The dopant concentration is measured from spreading resistance shows that most of the implanted As has been activated.

Low energy hydrogen ion implantation may also be used to improve the performance of dendritic web photovoltaic cells. Cells fabricated on dendritic web silicon in n$^+$/p/p$^+$ structure give device efficiencies as high as 15% under standard illumination conditions of air mass one (AM1) with an average device efficiency of about 13% in AM1. This compares favorably with cells fabricated on float zone silicon which is a single crystal using the same process where efficiencies of between 14 and 15% were obtained in AM1. The use of hydrogen ion beam passivation dramatically improves those web cells in the tail of the efficiency distribution. The result of using hydrogen ion beam passivation is a much tighter distribution of cell efficiencies.

Web cells in a n$^+$/p/p$^+$ configuration were exposed to hydrogen ion beams with ion energies in a range of 0.4 KeV to 1.4 KeV. These exposed cell structures had the collector grids applied prior to hydrogen ion beam exposure of the front of the cell surface. Beam energies of $E \simeq 0.4$ KeV proved to be most effective.

Table 1 provides a summary of the experimental verification of the invention. It is shown that 70 KeV, $4 \times 10^{15}$ cm$^{-2}$ arsenic implantation followed by 550° C. for 75 minutes and 900° C. for 30 minutes thermal anneal in nitrogen is not sufficient to produce low leakage junctions. Leakage current in these devices of the order of $10^4$ na/cm$^2$ which is about 3 to 4 orders of magnitude higher than a desirable value. Table 1 also shows that if we take the 550° C. for 75 minutes and 900° C. for 30 minutes N$_2$ anneal devices with no contact metal and implant 0.4 KeV hydrogen ions with a current density $\sim 10^{-3}$ amps/cm$^2$ from a Kaufman ion source, then leakage can be reduced to $10^3$ na/cm$^2$ from $10^4$ na/cm$^2$. This demonstrates that hydrogen ions can indeed passivate thermally unannealable defects at 900° C. and thereby reduce the leakage current.

Next in verification of the efficacy of low energy hydrogen ion implantation was bypassing the initial 550° C. and 900° C. annealing treatment. After the arsenic implantation, 0.4 KeV hydrogen ions were implanted and then the device was annealed at 500° C. for one hour in N$_2$. The results for device 2 given in Table 1 show that the leakage current is reduced to 100 na/cm$^2$. Spreading resistance data in FIG. 5 shows the dopant activation at the surface is about 50% as expected. The junction depth is shallower $\sim 0.15$ $\mu$m compared to 0.17 $\mu$m in the conventional 900° C. annealed devices.

Device 3 which received straight 500° C. for one hour heat treatment after arsenic implantation without the hydrogen ions showed a leakage current of $5 \times 10^4$ na/cm$^2$ but nearly complete dopant activation at the surface within a factor of 2. This indicates the 500° C. for one hour heat treatment helps the dopant activation but is not sufficient to reduce the leakage current. Hydrogen ions are needed to provide the defect passivation and lower the leakage current from $5 \times 10^4$ na/cm$^2$ to $10^2$ na/cm$^2$.

Table 2 shows an example of the improvement that can be seen in dendritic web photovoltaic cells in the tail of an efficiency distribution when low energy hydrogen ion beam implantation is used to reduce the number of bulk recombination centers in the web silicon photovoltaic cell.

Low energy hydrogen ion implantation with low temperature annealing offers an alternative to other processes used for annealing out implantation damage and to activate dopants in implanted silicon. Low energy hydrogen ion implantation and low temperature annealing processing for damage passivation and dopant activation not only provides results comparable to other annealing processes but also allows the passivation of electrically active residual defects an advantage not offered by other techniques. Although furnace anneals were used to activate the dopants the process is not limited to this because low energy hydrogen ion implants can be used in conjunction with lower temperature RTA approaches reducing the processing time involved. When used with broad beam ion sources this process can be adapted to the fabrication of extremely shallow junctions used in VLSI as well as dendritic web photovoltaic cells.

TABLE 1

| Device No. | Device Description | Leakage Current (na/cm$^2$) |
|---|---|---|
| 1-a | $4 \times 10^{15}$ cm$^{-2}$ As implant, 550° C./75 min + 900° C./30 min anneal | $10^4$ |
| 1-6 | $4 \times 10^{15}$ cm$^{-2}$ As implant, 550° C./75 min + 900° C./30 min anneal, H$^+$ implant, 500° C./1 hour anneal | $10^3$ |
| 2 | $4 \times 10^{15}$ cm$^{-2}$ As implant, H$^+$ implant, 500° C./1 hour anneal | $10^2$ |
| 3 | $4 \times 10^{15}$ cm$^{-2}$ As implant, 500° C./1 hour anneal | $5 \times 10^4$ |

TABLE 2

| Processing | J$_{SC}$ (mA/cm$^2$) | V$_{OC}$ (Volts) | Fill Factor | Efficiency (%) |
|---|---|---|---|---|
| Before H$^+$ Ion Beam; No Antireflective Coating | 22.77 | .548 | .688 | 8.59 |
| After H$^+$ Ion Beam; No Antireflective Coating | 22.94 | .566 | .766 | 9.94 |
| After H$^+$ Ion Beam; No Antireflective coating | 31.95 | .576 | .764 | 14.04 |

We claim:
1. A method of low temperature annealing of a silicon semiconductor that has been doped by ion implantation with an element selected from the group consisting of arsenic and phosphorous, said method comprising:
   ion beam implantation of hydrogen ions subsequent to and in the same area as the element selected from the above group that has been implanted, and
   annealing the semiconductor at a temperature between about 500° C. and about 600° C. for a time of about one hour in an inert atmosphere.
2. The process of claim 1 wherein the hydrogen ions are supplied by a Kaufman ion source.
3. The method of claim 1 wherein said silicon semiconductor has a shallow junction of $\leq 0.1$ µm.
4. The method of claim 1 wherein said silicon semiconductor has been doped with about 70 to 75 KeV, $4 \times 10^{15}$ cm$^{-2}$ arsenic.
5. The method of claim 1 wherein said inert atmosphere comprises nitrogen.
6. The method of claim 1 wherein said inert atmosphere comprises argon.
7. The method of claim 1 wherein hydrogen ions are implanted with a current density of about $10^{-3}$ amps/cm$^2$.
8. The method of claim 1 wherein the hydrogen ions implanted have an energy of between about 0.4 KeV and about 1.4 KeV.
9. The method of claim 1 wherein the annealing temperature is about 500° C. and the annealing time is about one hour.
10. The method of claim 1 wherein said semiconductor is a photovoltaic cell.
11. The method of claim 10 wherein said semiconductor is a dendritic web silicon photovoltaic cell.

* * * * *